(12) United States Patent
Ogata

(10) Patent No.: US 12,407,319 B2
(45) Date of Patent: Sep. 2, 2025

(54) FILTER DEVICE AND RADIO-FREQUENCY FRONT-END CIRCUIT INCLUDING THE SAME

(71) Applicant: Murata Manufacturing Co., Ltd., Nagaokakyo (JP)

(72) Inventor: Makoto Ogata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 197 days.

(21) Appl. No.: 18/223,073

(22) Filed: Jul. 18, 2023

(65) Prior Publication Data

US 2024/0048113 A1 Feb. 8, 2024

(30) Foreign Application Priority Data

Aug. 8, 2022 (JP) .................. 2022-126529

(51) Int. Cl.
*H03H 7/01* (2006.01)
(52) U.S. Cl.
CPC ........ *H03H 7/1708* (2013.01); *H03H 7/0115* (2013.01); *H03H 7/1775* (2013.01)
(58) Field of Classification Search
CPC .......... H03H 7/01; H03H 7/0115; H03H 7/17; H03H 7/1708; H03H 7/1775; H03H 7/1791; H03H 3/00
USPC ........................................ 333/167, 175, 185
See application file for complete search history.

(56) References Cited

U.S. PATENT DOCUMENTS

| | | | |
|---|---|---|---|
| 12,040,767 B2* | 7/2024 | Masuda | H01G 4/30 |
| 2022/0158603 A1 | 5/2022 | Masuda et al. | |
| 2023/0044655 A1 | 2/2023 | Ogata et al. | |
| 2023/0188110 A1 | 6/2023 | Taniguchi et al. | |

FOREIGN PATENT DOCUMENTS

| | | |
|---|---|---|
| JP | H036095 A | 1/1991 |
| JP | H03262313 A | 11/1991 |
| WO | 2021/039246 A1 | 3/2021 |
| WO | 2022/019112 A1 | 1/2022 |
| WO | 2022059373 A1 | 3/2022 |

* cited by examiner

*Primary Examiner* — Hai L Nguyen
(74) *Attorney, Agent, or Firm* — Keating & Bennett, LLP

(57) ABSTRACT

A filter device includes a multilayer body including dielectric layers, an input terminal, an output terminal, a ground terminal, a common electrode, a ground electrode, resonators, a shield electrode, and ground vias. A first ground via couples the shield electrode and the ground electrode via the common electrode. A second ground via directly couples the shield electrode and the ground electrode without passing the common electrode. A first via of a first resonator has one end coupled to the common electrode and another end coupled to the input terminal. A first plate electrode is coupled to the first via and at least partially overlaps the ground electrode when viewed in plan view. A second resonator includes second vias and a second plate electrode. The second plate electrode is coupled to the second via and at least partially overlaps the ground electrode when viewed in plan view in the stacking direction.

8 Claims, 11 Drawing Sheets

FILTER DEVICE AND RADIO-FREQUENCY FRONT-END CIRCUIT INCLUDING THE SAME

CROSS REFERENCE TO RELATED APPLICATIONS

This application claims the benefit of priority to Japanese Patent Application No. 2022-126529 filed on Aug. 8, 2022. The entire contents of this application are hereby incorporated herein by reference.

BACKGROUND OF THE INVENTION

1. Field of the Invention

The present disclosure relates to a filter device and a radio-frequency front-end circuit including the filter device, and more particularly, to a technology for improving characteristics of a filter device.

2. Description of the Related Art

International Publication No. 2022/019112 discloses a filter device including multiple resonators that are coupled to a common electrode provided close to the upper surface of a body. In the filter device, an internal shield electrode coupled to a ground electrode is further provided closer to the upper surface than the common electrode.

SUMMARY OF THE INVENTION

In the filter device disclosed in International Publication No. 2022/019112, the internal shield electrode mitigates coupling between a shield electrode in an external device outside the filter device (an external shield electrode) and the common electrode of the filter device. This reduces changes of filter characteristics due to the presence of the external shield electrode.

However, in the filter device disclosed in International Publication No. 2022/019112, a via connecting the internal shield electrode and the ground electrode is shared with the resonators as ground vias for the individual resonators. The resonators can thus be coupled to each other via the internal shield electrode. As a result, when an internal shield electrode as described in International Publication No. 2022/019112 is used, an external shield electrode can affect coupling among resonators. To enhance filter characteristics, it is necessary to minimize, to the greatest extent possible, such an influence of an external shield electrode.

Preferred embodiments of the present invention enhance filter characteristics of filter devices including resonators by reducing the influence of an external shield electrode.

A filter device according to an aspect of a preferred embodiment of the present disclosure includes a multilayer body including a stack of a plurality of dielectric layers, a first surface and a second surface, an input terminal, an output terminal, and a ground terminal at the second surface of the multilayer body, a common electrode closer to the first surface than to the second surface in the multilayer body, a ground electrode coupled to the ground terminal, a first resonator and a second resonator in a layer between the common electrode and the ground electrode, a shield electrode closer to the first surface than the common electrode and covering the entire common electrode when viewed in plan view in a stacking direction of the multilayer body, a first ground via coupling the shield electrode and the ground electrode via the common electrode, and a second ground via directly coupling the shield electrode and the ground electrode without passing the common electrode, the first resonator including a first via including one end coupled to the common electrode and another end coupled to the input terminal; and a first plate electrode coupled to the first via and at least partially overlapping the ground electrode when viewed in plan view in the stacking direction, the second resonator including a second via including one end coupled to the common electrode and another end coupled to the output terminal, and a second plate electrode coupled to the second via and at least partially overlapping the ground electrode when viewed in plan view in the stacking direction.

A filter device according to another aspect of a preferred embodiment of the present disclosure includes a multilayer body including a stack of a plurality of dielectric layers, a first surface and a second surface, an input-output terminal and a ground terminal at the second surface of the multilayer body, a first electrode closer to the first surface than to the second surface in the multilayer body, a ground electrode coupled to the ground terminal, a resonator in a layer between the first electrode and the ground electrode, a shield electrode closer to the first surface than the first electrode and covering the first electrode when viewed in plan view in a stacking direction of the multilayer body, a fifth ground via coupling the shield electrode and the ground electrode via the first electrode, and a sixth ground via directly coupling the shield electrode and the ground electrode without passing the first electrode, the resonator including a fifth via including one end coupled to the first electrode and another end coupled to the input-output terminal, and a second electrode coupled to the fifth via, the second electrode at least partially overlapping the ground electrode when viewed in plan view in the stacking direction.

A filter device according to still another aspect of a preferred embodiment of the present disclosure includes a multilayer body including a stack of a plurality of dielectric layers, a first surface and a second surface, an input terminal, an output terminal, and a ground terminal at the second surface of the multilayer body, a common electrode closer to the first surface than to the second surface in the multilayer body, a ground electrode coupled to the ground terminal, a first resonator and a second resonator in a layer between the common electrode and the ground electrode, a first shield electrode and a second shield electrode closer to the first surface than the common electrode, a first ground via coupling the first shield electrode and the ground electrode via the common electrode, a second ground via directly coupling the first shield electrode and the ground electrode without passing the common electrode, a third ground via coupling the second shield electrode and the ground electrode via the common electrode, and a fourth ground via directly coupling the second shield electrode and the ground electrode without passing the common electrode, the first shield electrode and the second shield electrode covering almost the entire common electrode when viewed in plan view in a stacking direction of the multilayer body, the first resonator including a first via including one end coupled to the common electrode and another end coupled to the input terminal; and a first plate electrode coupled to the first via and at least partially overlapping the ground electrode when viewed in plan view in the stacking direction, the second resonator including a second via including one end coupled to the common electrode and another end coupled to the output terminal, and a second plate electrode coupled to the second via and at least partially overlapping the ground electrode when viewed in plan view in the stacking direction.

In a filter device according to a preferred embodiment of the present disclosure, a ground via (a first ground via, a third ground via, a fifth ground via) coupled to a ground electrode via a common electrode and a ground via (a second ground via, a fourth ground via, a sixth ground via) directly coupled to the ground electrode without passing the common electrode are coupled to the shield electrode. In this configuration, a greater portion of the signal (current) flowing in the resonator is transferred to the ground electrode via the ground via passing the common electrode, and almost no signal is transferred to the path routed via the ground via and the shield electrode without passing the common electrode. As a result, when an external shield electrode of an external device is present nearby, it is possible to enhance filter characteristics of a filter device including resonators by reducing the influence of an external shield electrode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
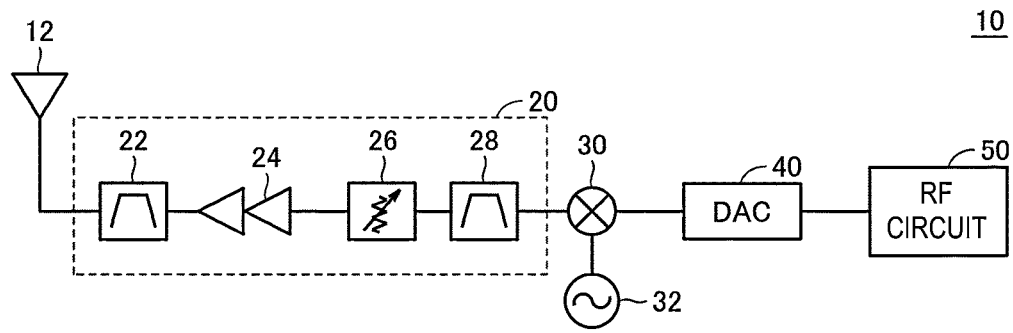
FIG. 1 is a block diagram of a communication device including a radio-frequency front-end circuit including a filter device according to a first preferred embodiment of the present invention.

Hereinafter, preferred embodiments of the present disclosure will be described in detail with reference to the drawings. Identical or corresponding portions in the drawings are assigned identical reference characters, and descriptions thereof are not repeated.

First Preferred Embodiment

Basic Configuration of Communication Device

FIG. 1 is a block diagram of a communication device 10 including a radio-frequency front-end circuit 20 including a filter device of a first preferred embodiment. The communication device 10 is, for example, a mobile terminal or mobile phone base station.

Referring to FIG. 1, the communication device 10 includes an antenna 12, the radio-frequency front-end circuit 20, a mixer 30, a local oscillator 32, a digital-to-analog (D/A) converter (DAC) 40, and a radio-frequency (RF) circuit 50. The radio-frequency front-end circuit 20 includes band pass filters 22 and 28, an amplifier 24, and an attenuator 26. FIG. 1 illustrates the case in which the radio-frequency front-end circuit 20 includes a transmit circuit to transmit radio-frequency signals from the antenna 12. The radio-frequency front-end circuit 20 may, however, include a receive circuit to receive radio-frequency signals through the antenna 12.

With the communication device 10, a transmit signal transferred from the RF circuit 50 is up-converted into a radio-frequency signal and emitted from the antenna 12. A modulated digital signal that is a transmit signal outputted from the RF circuit 50 is converted into an analog signal by the D/A converter 40. The mixer 30 mixes an analog transmit signal converted from a digital signal by the D/A converter 40 with an oscillating signal from the local oscillator 32, so that the mixer 30 up-converts the transmit signal into a radio-frequency signal. The band pass filter 28 removes spurious waves generated by up-conversion and extracts only transmit signals of a desired frequency band. The attenuator 26 controls the intensity of transmit signal. The amplifier 24 electrically amplifies the transmit signal passed through the attenuator 26 to a particular level. As well as removing spurious waves generated in the process of amplification, the band pass filter 22 passes only signal components of a frequency band specified by a communication standard. The transmit signal passed through the band pass filter 22 is emitted from the antenna 12.

A filter device according to a preferred embodiment of the present disclosure can be used as the band pass filters 22 and 28 in the communication device 10 described above.

Configuration of Filter Device

Figure 2:
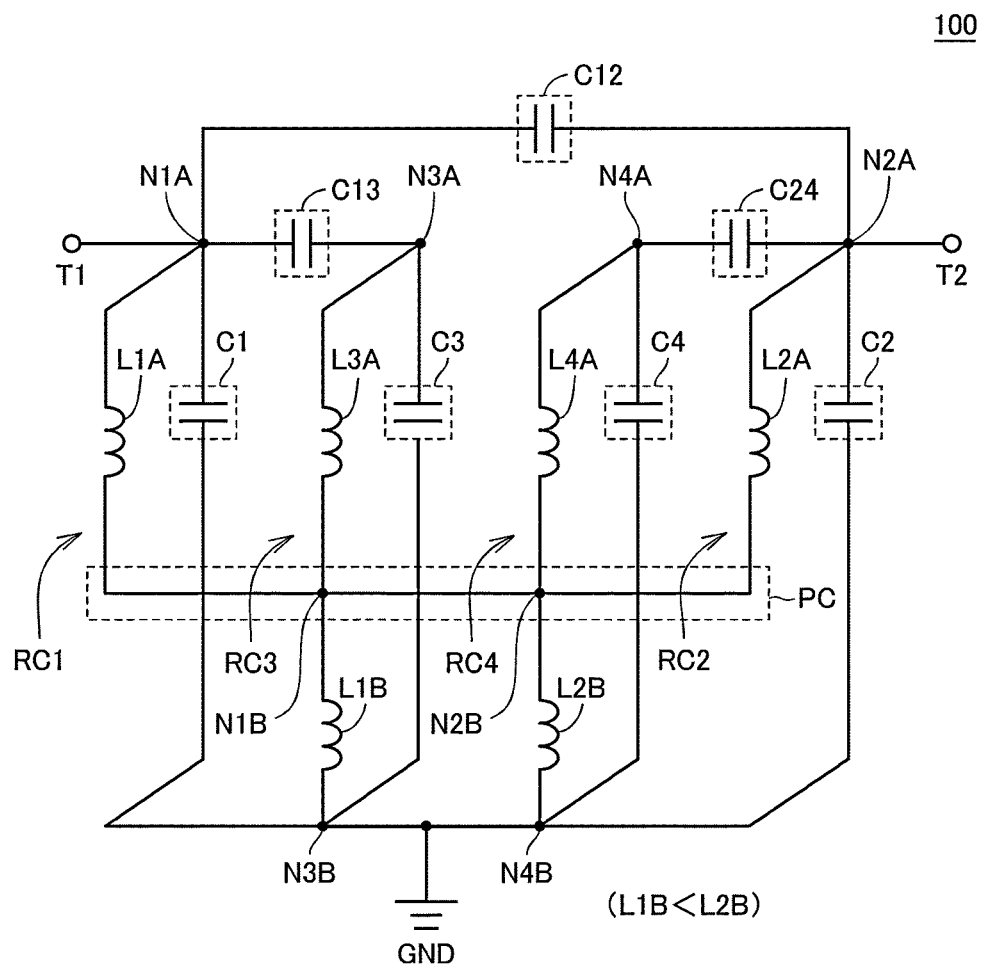
FIG. 2 is an equivalent circuit diagram of the filter device of the first preferred embodiment of the present invention.
Figure 3:
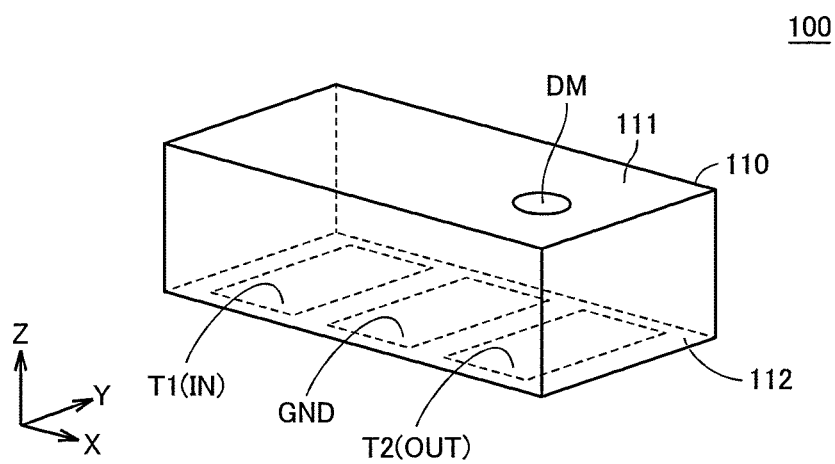
FIG. 3 is an external perspective view of the filter device of the first preferred embodiment of the present invention.
Figure 4:
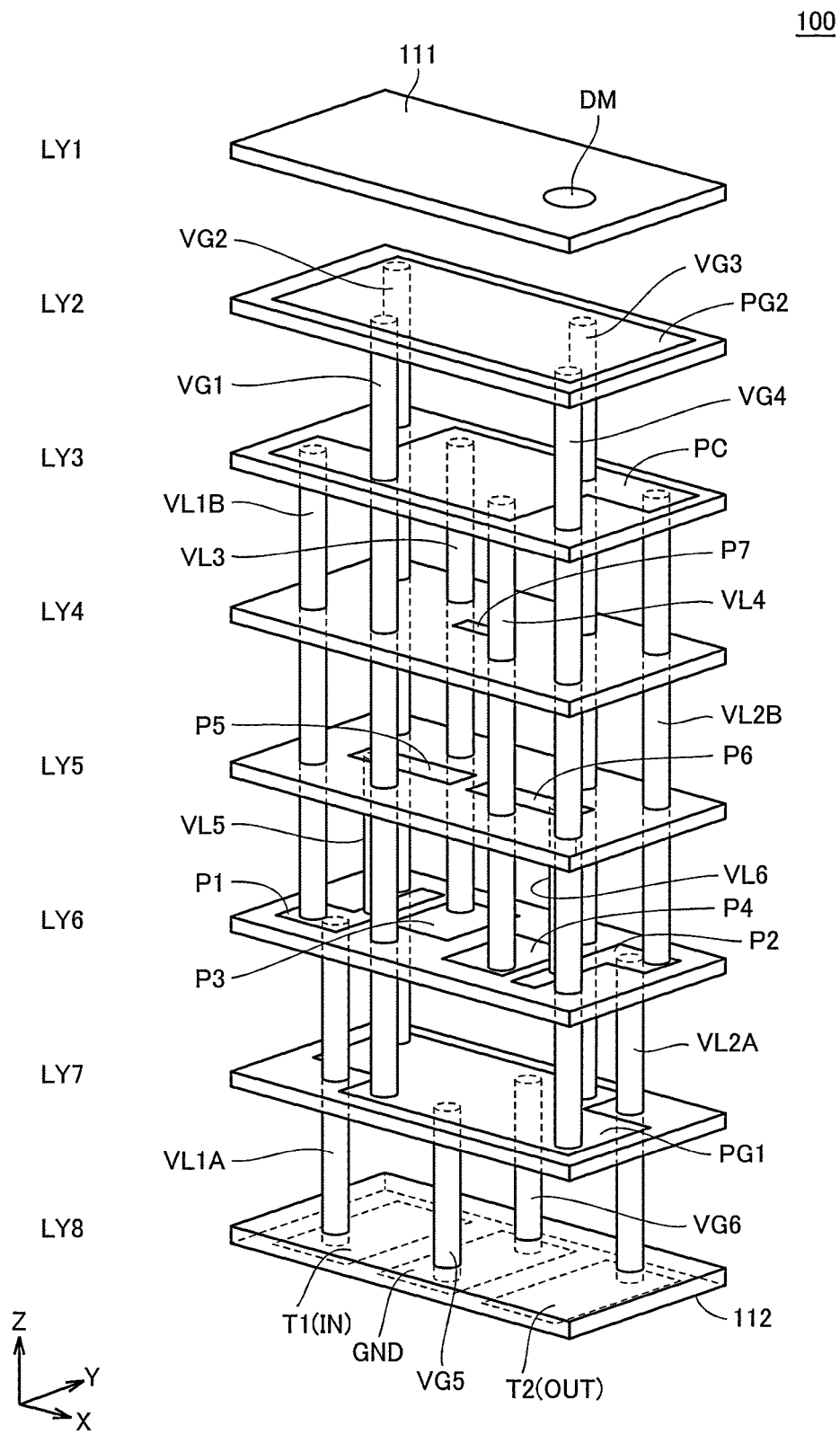
FIG. 4 is an exploded perspective view illustrating a layered structure of the filter device of the first preferred embodiment of the present invention.

The following describes a specific configuration of a filter device 100 of the first preferred embodiment with reference to FIGS. 2 to 4.

FIG. 2 is an equivalent circuit diagram of the filter device 100. Referring to FIG. 2, the filter device 100 includes an input terminal T1, an output terminal T2, a ground terminal GND, and resonators RC1 to RC4. The resonators RC1 to RC4 are all LC parallel resonators each including inductors and a capacitor that are coupled in parallel to each other.

The resonator RC1 includes inductors L1A and L1B, which are coupled in series between the input terminal T1 and the ground terminal GND, an inductor L2B, which is coupled in parallel with the inductor L1B, and a capacitor C1, which is coupled in parallel with the inductors L1A and L1B. A connection node N1A of the inductor L1A and the capacitor C1 is coupled to the input terminal T1. A connection node N3B of the inductor L1B and the capacitor C1 is coupled to the ground terminal GND. The inductance of the inductor L2B is larger than the inductance of the inductor L1B.

The resonator RC2 includes an inductor L2A and the inductor L2B, which are coupled in series between the output terminal T2 and the ground terminal GND, the inductor L1B, which is coupled in parallel with the inductor L2B, and a capacitor C2, which is coupled in parallel with the inductors L2A and L2B. A connection node N2A of the inductor L2A and the capacitor C2 is coupled to the output terminal T2. A connection node N4B of the inductor L2B and the capacitor C2 is coupled to the ground terminal GND. This means that the inductors L1B and L2B coupled in parallel with each other are shared with the resonator RC1.

The resonator RC3 includes an inductor L3A and the inductor L1B, which are coupled in series with each other, the inductor L2B, which is coupled in parallel with the inductor L1B, and a capacitor C3, which is coupled in parallel with the inductors L3A and L1B. A connection node N3A of the inductor L3A and the capacitor C3 is coupled to the connection node N1A of the resonator RC1 (consequently to the input terminal T1) via a capacitor C13. In the resonator RC3 as well, the inductors L1B and L2B coupled in parallel with each other are shared with the resonator RC1.

The resonator RC4 includes an inductor L4A and the inductor L2B, which are coupled in series with each other, the inductor L1B, which is coupled in parallel with the inductor L2B, and a capacitor C4, which is coupled in parallel with the inductors L4A and L2B. A connection node N4A of the inductor L4A and the capacitor C4 is coupled to the connection node N2A of the resonator RC2 (consequently to the output terminal T2) via a capacitor C24. In the resonator RC4 as well, the inductors L1B and L2B coupled in parallel with each other are shared with the resonator RC1.

The connection node N1A of the resonator RC1 (the input terminal T1) is coupled to the connection node N2A of the resonator RC2 (the output terminal T2) via the capacitor C12. The portions indicated by connection nodes N1B and N2B, at which the inductors L1A, L2A, L3A, and L4A of the respective resonators are coupled to one another, correspond to a common electrode PC that will be described later with reference to the drawings including FIG. 4.

The resonators can be coupled to each other via magnetic fields. As described above, the filter device 100 has a configuration including four-stage resonators that can be coupled to each other via magnetic fields, arranged between the input terminal T1 and the output terminal T2. By controlling the resonant frequencies of the individual resonators, the filter device 100 operates as a band pass filter that passes signals in a desired frequency band.

FIG. 3 is an external perspective view of the filter device 100. FIG. 4 is an exploded perspective view of an example of a layered structure of the filter device 100.

Referring to FIGS. 3 and 4, the filter device 100 has a rectangular or almost rectangular multilayer body 110 including multiple dielectric layers LY1 to LY8 that are stacked in a stacking direction. The dielectric layers LY1 to LY8 are made of a ceramic such as a low temperature co-fired ceramic (LTCC) or a resin. Inside the multilayer body 110, multiple electrodes provided in the dielectric layers and multiple vias provided between the dielectric layers define inductors and capacitors of LC parallel resonators. As used in this specification, the term "via" refers to a conductor provided between dielectric layers to connect electrodes in different dielectric layers. The vias are made by, for example, applying a conductive paste, plating, and/or disposing metal pins.

In the following description, the stacking direction of the dielectric layers LY1 to LY8 of the multilayer body 110 is referred to as the "Z-axis direction"; the direction along the long side of the multilayer body 110 perpendicular to the Z-axis direction is referred to as the "X-axis direction"; the direction along the short side of the multilayer body 110 is referred to as the "Y-axis direction". Additionally in the following, the positive direction of the Z axis in the drawings is referred to as upper, and the negative direction is referred to as lower in some cases.

An orientation mark DM indicating the orientation of the filter device 100 is provided on an upper surface 111 (the dielectric layer LY1) of the multilayer body 110. External terminals to connect the filter device 100 to external devices (the input terminal T1, the output terminal T2, and the ground terminal GND) are arranged at a lower surface 112 (the dielectric layer LY8) of the multilayer body 110. The input terminal T1, the output terminal T2, and the ground terminal GND are plate electrodes. The input terminal T1, the output terminal T2, and the ground terminal GND are land grid array (LGA) connectors regularly arranged at the lower surface 112 of the multilayer body 110. "The upper surface 111" and "the lower surface 112" of the first preferred embodiment respectively correspond to "a first surface" and "a second surface".

As described with reference to FIG. 2, the filter device 100 includes four-stage LC parallel resonators. More specifically, the filter device 100 includes the resonator RC1 including vias VL1A and VL1B and a capacitor electrode P1, the resonator RC2 including vias VL2A and VL2B and a capacitor electrode P2, the resonator RC3 including a via VL3 and a capacitor electrode P3, and the resonator RC4 including a via VL4 and a capacitor electrode P4. The vias VL1B, VL2B, VL3, and VL4 are coupled to the common electrode PC provided in the dielectric layer LY3.

The common electrode PC is coupled to a ground electrode PG1 provided in the dielectric layer LY6 and a shield electrode PG2 provided in the dielectric layer LY2 by vias VG1 and VG3. The ground electrode PG1 is directly coupled to the shield electrode PG2 by vias VG2 and VG4. The ground electrode PG1 is coupled to the ground terminal GND in the dielectric layer LY8 by vias VG5 and VG6. The capacitor electrodes P1, P2, P3, and P4 are provided in the dielectric layer LY6.

The input terminal T1 is coupled to the capacitor electrode P1 provided in the dielectric layer LY6 by the via VL1A. The capacitor electrode P1 is coupled to the common electrode PC provided in the dielectric layer LY2 by the via VL1B. The capacitor electrode P1 is an almost L-shaped plate electrode. When the multilayer body 110 is viewed in plan view in the stacking direction (the Z-axis direction), a portion of the capacitor electrode P1 overlaps the ground electrode PG1 provided in the dielectric layer LY7. The capacitor C1 in FIG. 2 is defined by the capacitor electrode P1 and the ground electrode PG1.

The inductor L1A in FIG. 2 is defined by the via VL1B and the common electrode PC. The inductor L1B in FIG. 2 is defined by a portion of the via VG1 and a portion of the via VG3 that are present between the common electrode PC and the ground electrode PG1. The inductor L2B in FIG. 2 is defined by a portion of the via VG1 and a portion of the via VG3 that are present between the common electrode PC and the shield electrode PG2, the shield electrode PG2, and the vias VG2 and VG4. Overall, the resonator RC1 is defined by the capacitor electrode P1, the ground electrode PG1, the shield electrode PG2, the vias VL1B and VG1 to VG4, and the common electrode PC.

The output terminal T2 is coupled to the capacitor electrode P2 provided in the dielectric layer LY6 by the via VL2A. The capacitor electrode P2 is coupled to the common electrode PC provided in the dielectric layer LY2 by the via VL2B. The capacitor electrode P2 is an almost L-shaped plate electrode. When the multilayer body 110 is viewed in plan view in the stacking direction, a portion of the capacitor electrode P2 overlaps the ground electrode PG1 provided in the dielectric layer LY7. The capacitor C2 in FIG. 2 is defined by the capacitor electrode P2 and the ground electrode PG1. The inductor L2A in FIG. 2 is defined by the via VL2B and the common electrode PC. Overall, the resonator RC2 is defined by the capacitor electrode P2, the ground electrode PG1, the shield electrode PG2, the vias VL2B and VG1 to VG4, and the common electrode PC.

The capacitor electrode P1 of the resonator RC1 is coupled to a capacitor electrode P5 provided in the dielectric layer LY5 by a via VL5. The capacitor electrode P5 is a rectangular or substantially rectangular plate electrode. When the multilayer body 110 is viewed in plan view in the stacking direction, a portion of the capacitor electrode P5 overlaps the capacitor electrode P3 of the resonator RC3 provided in the dielectric layer LY6. The capacitor C13 in FIG. 2 is defined by the capacitor electrodes P3 and P5. The via VL3 is coupled to the capacitor electrode P3 and the common electrode PC. The resonator RC3 is defined by the capacitor electrode P3, the ground electrode PG1, the shield electrode PG2, the vias VL3 and VG1 to VG4, and the common electrode PC.

The capacitor electrode P2 of the resonator RC2 is coupled to a capacitor electrode P6 provided in the dielectric layer LY5 by a via VL6. The capacitor electrode P6 is a rectangular or substantially rectangular plate electrode. When the multilayer body 110 is viewed in plan view in the stacking direction, a portion of the capacitor electrode P6 overlaps the capacitor electrode P4 of the resonator RC4 provided in the dielectric layer LY6. The capacitor C24 in FIG. 2 is defined by the capacitor electrodes P4 and P6. The via VL4 is coupled to the capacitor electrode P4 and the common electrode PC. The resonator RC4 is defined by the capacitor electrode P4, the ground electrode PG1, the shield electrode PG2, the vias VL4 and VG1 to VG4, and the common electrode PC.

A rectangular or substantially rectangular capacitor electrode P7 is provided in the dielectric layer LY4. When the multilayer body 110 is viewed in plan view in the stacking direction, the capacitor electrode P7 partially overlaps the capacitor electrodes P5 and P6 provided in the dielectric layer LY5. The capacitor C12 in FIG. 2 is defined by the capacitor electrodes P5 to P7.

"The vias VL1A and VL1B" in the first preferred embodiment correspond to "a first via". "The vias VL2A and VL2B" in the first preferred embodiment correspond to "a second via". "The via VL3" and "the via VL4" in the first embodiment respectively correspond to "a third via" and "a fourth via". Each of "the vias VG1 and VG3" in the first preferred embodiment corresponds to "a first ground via". Each of "the vias VG2 and VG4" in the first preferred embodiment corresponds to "a second ground via". "The capacitor electrodes P1 to P7" in the first preferred embodiment respectively correspond to "a first plate electrode" to "a seventh plate electrode".

Filter Characteristic

Figure 5:
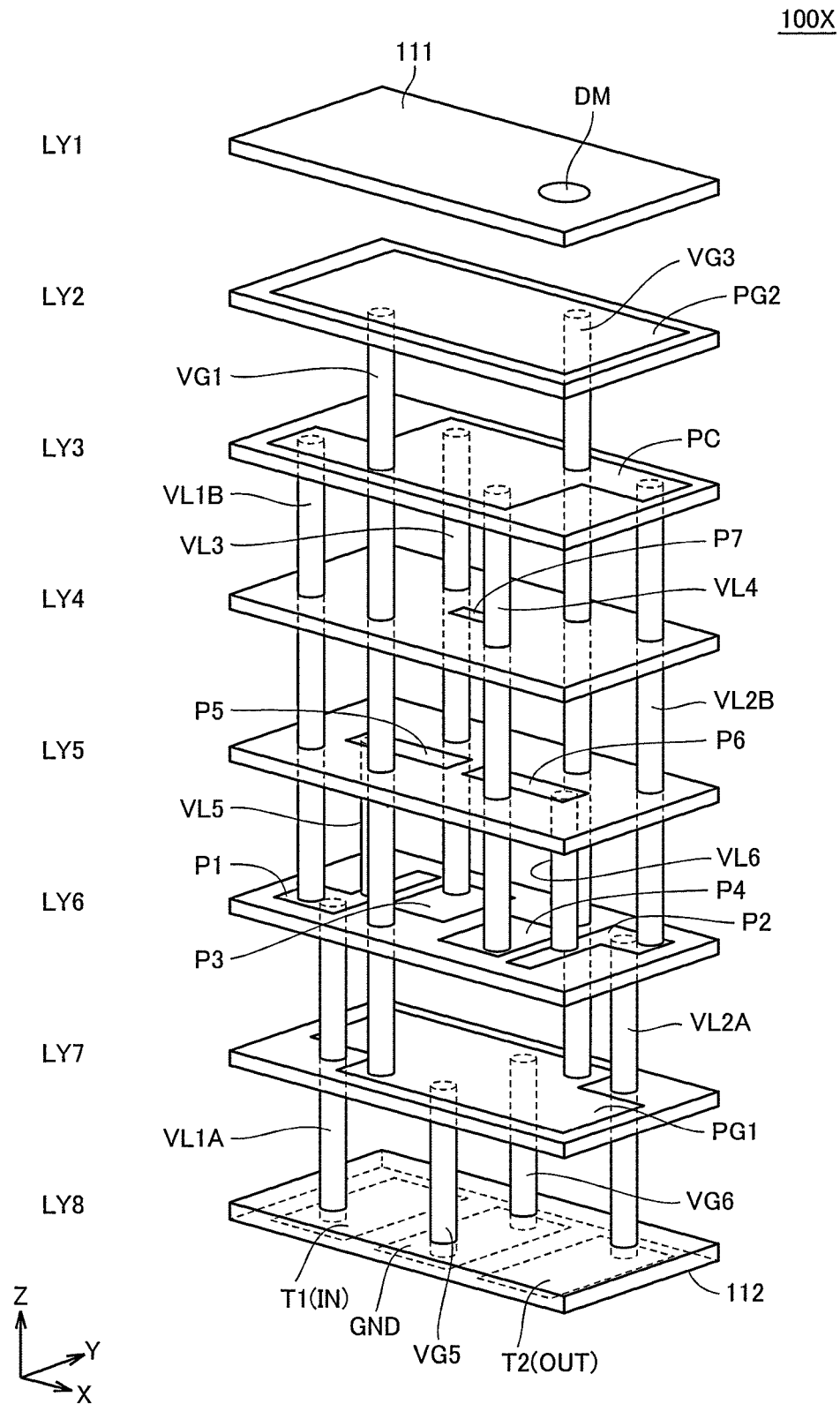
FIG. 5 is an exploded perspective view illustrating a layered structure of a filter device of a comparative example.
Figure 6:
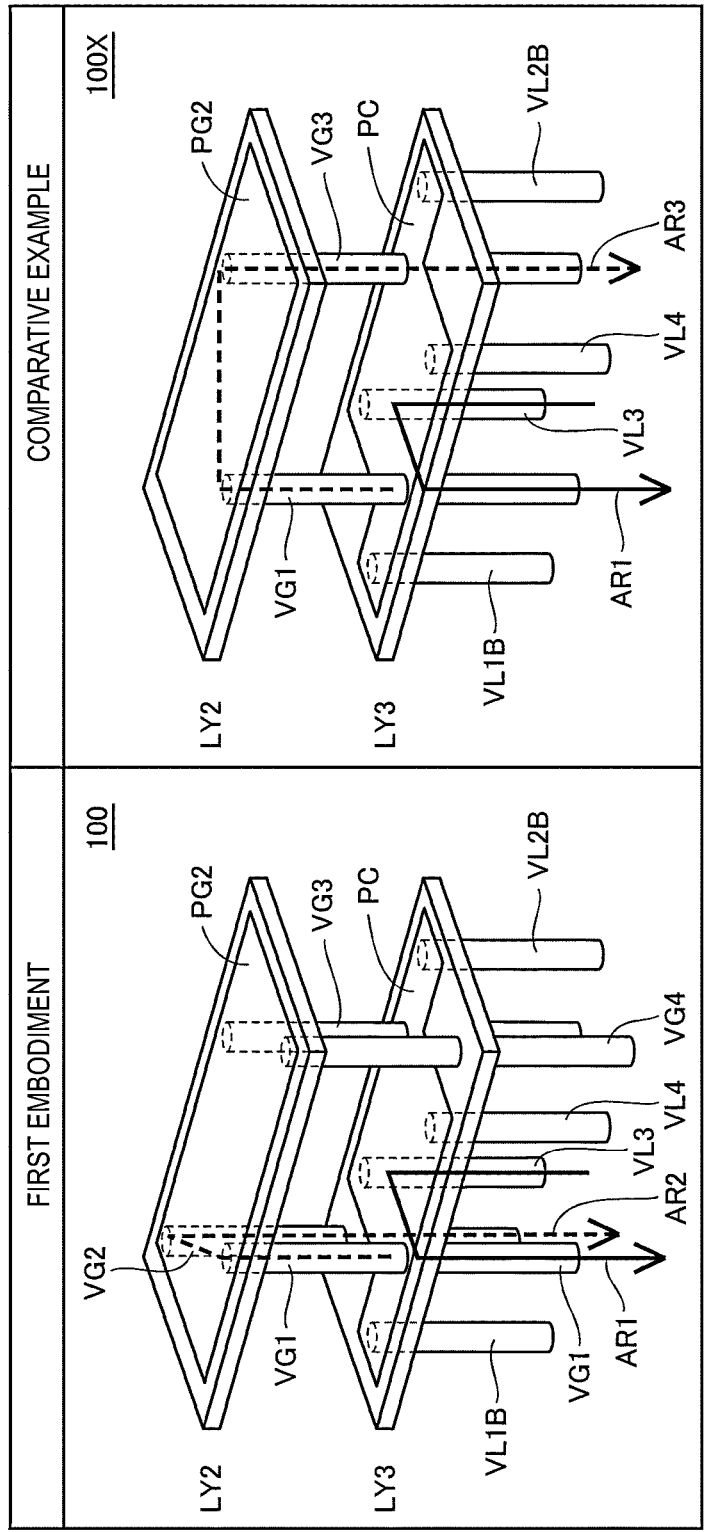
FIG. 6 illustrates a signal path of the filter device of the first preferred embodiment of the present invention and a signal path of the filter device of the comparative example.
Figure 7:
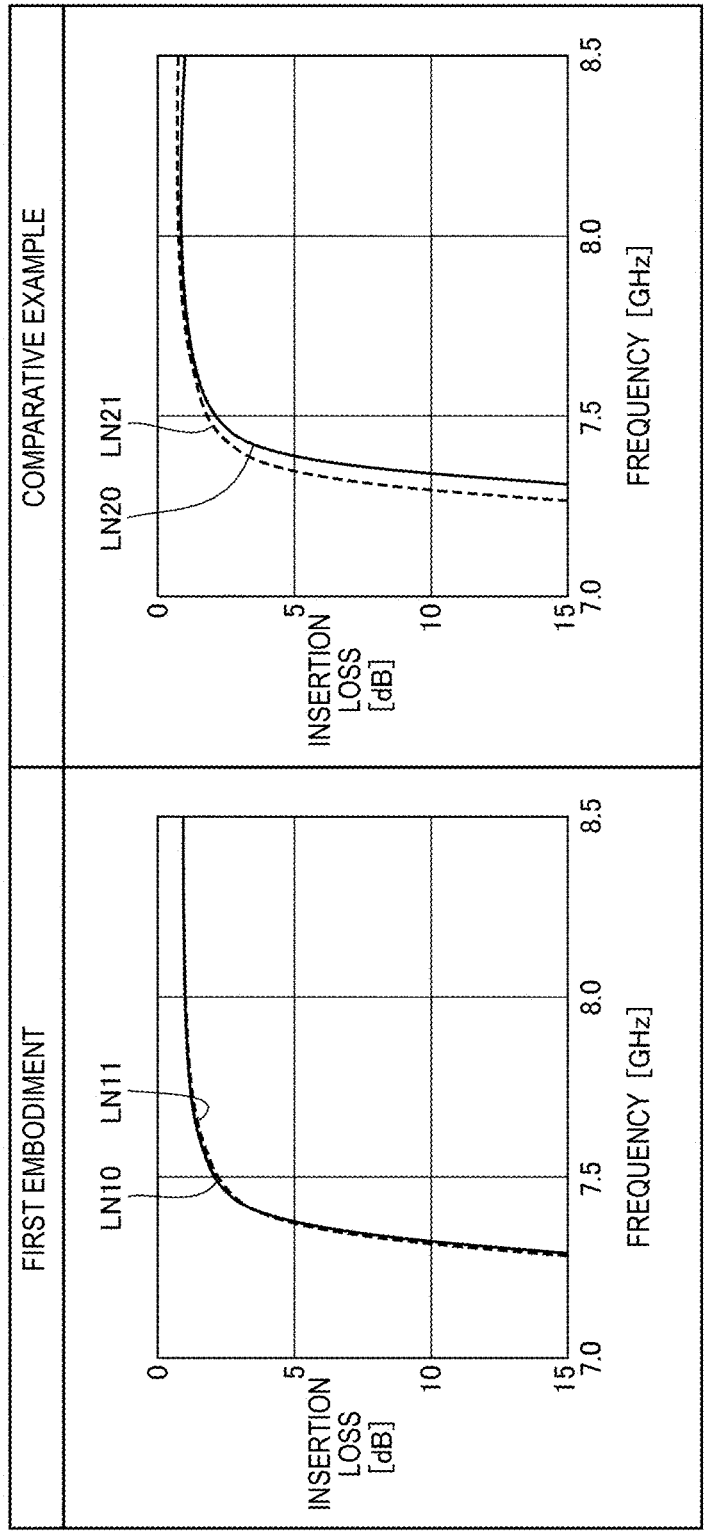
FIG. 7 illustrates the bandpass characteristic of the filter device of the first preferred embodiment of the present invention and the bandpass characteristic of the filter device of the comparative example.

The following describes a filter characteristic of the filter device 100 of the first preferred embodiment with reference to FIGS. 5 to 7, while comparing the first preferred embodiment with a comparative example. FIG. 5 is an exploded perspective view of a filter device 100X of a comparative example. The filter device 100X has the same configuration as the filter device 100 described with reference to FIG. 4 except that the vias VG2 and VG4 are removed. Redundant descriptions of the same elements in FIG. 5 as the elements in FIG. 4 are not repeated.

FIG. 6 illustrates a signal path of the filter device of the first preferred embodiment and a signal path of the filter device of the comparative example. In FIG. 6, the left illustration depicts a portion of an exploded perspective view of the filter device 100 of the first preferred embodiment, and the right illustration depicts a portion of an exploded perspective view of the filter device 100X of the comparative example. With reference to FIG. 6, a signal flowing through the resonator RC3 in the second stage will be described, with additional reference to FIG. 2 or 4 when necessary.

A signal transferred from the resonator RC1 to the resonator RC3 via the capacitor C13 is transferred to the common electrode PC through the via VL3. Through the common electrode PC, the signal is further transferred to the via VG1, which is nearest to the via VL3. A greater portion of the signal flows to the ground electrode PG1 along the path indicated by a solid line arrow AR1. Additionally, a portion of the signal transferred to the via VG1 is transferred to the shield electrode PG2.

In the filter device 100X of the comparative example without the vias VG2 and VG4 depicted in the right illustration, a signal transferred to the shield electrode PG2 flows through the via VG3 that is used as the resonators RC2 and RC4 to the ground electrode PG1, as indicated by a dashed line arrow AR3. This means that a signal coupling the resonators RC3 and RC4 is transferred via the shield electrode PG2. As a result, when a shield electrode of an external device (an external shield electrode) is positioned close to the filter device 100X, the coupling between the resonators RC3 and RC4 is affected by this external shield electrode.

By contrast, in the filter device 100 of the first preferred embodiment, the signal transferred to the shield electrode PG2 is transferred to the via VG2, which is nearest to the via VG1. The signal then flows through the via VG2 to the ground electrode PG1 as indicated by a dashed line arrow AR2, whereas almost no signal flows to the via VG3. This means that the signal coupling the resonators RC3 and RC4 does not flow through the shield electrode PG2; as a result, when an external shield electrode exists, the coupling between the resonators RC3 and RC4 is not affected by the external shield electrode.

The path from the common electrode PC to the ground electrode PG1 via the shield electrode PG2 is longer than the path from the common electrode PC to the ground electrode PG1 via only the via VG1, and thus, the inductance of the path routed via the shield electrode PG2 is larger than the inductance of the path routed via only the via VG1. Most of the signal thus flows along the path routed via only the via VG1. The filter device 100X of the comparative example therefore reduces the influence of an external shield electrode, as compared to a configuration without the shield electrode PG2. Nevertheless, the configuration as in the first preferred embodiment, in which the vias VG2 and VG4 directly coupling the shield electrode PG2 and the ground electrode PG1 are provided, reduces the influence of an external shield electrode on coupling between resonators more than the comparative example.

FIG. 7 illustrates changes of the bandpass characteristic depending on the presence or absence of an external shield with respect to the filter device of the first preferred embodiment and the filter device of the comparative example. In FIG. 7, the left illustration is a graph of the bandpass characteristic of the filter device 100 of the first preferred embodiment, and the right illustration is a graph of the bandpass characteristic of the filter device 100X of the comparative example. In the graphs in FIG. 7, the horizontal axis indicates frequency, and the vertical axis indicates insertion loss. In the graphs, solid lines LN10 and LN20 indicate the bandpass characteristic when no external shield electrode is present, and dashed lines LN11 and LN21 indicate the bandpass characteristic when an external shield electrode is present.

Referring to FIG. 7, in the comparative example in the right illustration, the pass band when an external shield electrode is present is shifted to the lower frequency side as compared with the pass band when no external shield electrode is present; in other words, the characteristic of attenuation between the pass band and the non-passband is degraded. Such characteristic change does not necessarily have adverse effects on achieving a desired filter characteristic. However, if the presence or absence of an external shield electrode changes the filter characteristic, the performance of a device provided with the filter device can become unstable.

Conversely, in the first preferred embodiment in the left illustration, almost no change of the bandpass characteristic is caused by the presence or absence of an external shield electrode. Overall, the configuration as in the first preferred embodiment reduces the influence of an external shield electrode and improves (stabilizes) the filter characteristic, and consequently, the performance of a device provided with the filter device is made stable.

The filter device in the above description includes four resonators, but the filter device may include five or more resonators.

Second Preferred Embodiment

The following describes a second preferred embodiment in which multiple plate electrodes define shield electrodes.

Figure 8:
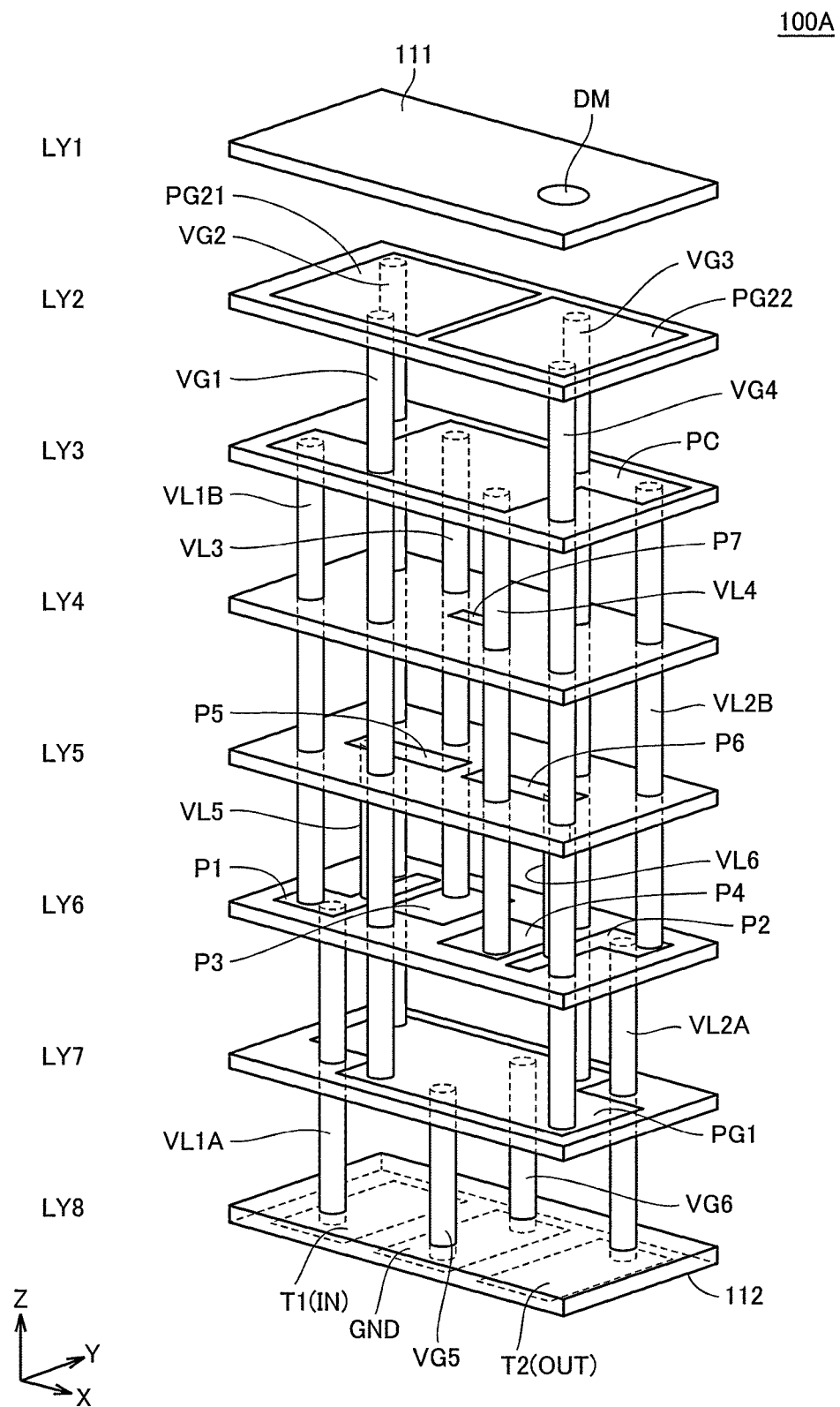
FIG. 8 is an exploded perspective view illustrating a layered structure of a filter device of a second preferred embodiment of the present invention.

FIG. 8 is an exploded perspective view illustrating a layered structure of a filter device 100A of the second preferred embodiment. In the filter device 100A, the shield electrode PG2 of the filter device 100 of the first preferred embodiment is replaced with shield electrodes PG21 and PG22. Regarding FIG. 8, redundant descriptions of the same elements as the filter device 100 illustrated in FIG. 4 are not repeated.

Referring to FIG. 8, the shield electrodes PG21 and PG22 are provided in the dielectric layer LY2 of the filter device 100A. The shield electrode PG21 is provided for the resonator RC1 in the first stage and the resonator RC3 in the second stage. The shield electrode PG22 is provided for the resonator RC4 in the third stage and the resonator RC2 in the fourth stage.

Both of the shield electrodes PG21 and PG22 are rectangular or substantially rectangular plate electrodes. The total size of the shield electrodes PG21 and PG22 is almost the same as the size of the shield electrode PG2 of the filter device 100 in FIG. 4. In other words, when viewed in plan view in the stacking direction of the multilayer body 110, the shield electrodes PG21 and PG22 cover the almost entire area of the common electrode PC. The vias VG1 and VG2 are coupled to the shield electrode PG21. The vias VG3 and VG4 are coupled to the shield electrode PG22.

Because vias coupled to the ground electrode PG1 without passing resonators are provided for the individual shield electrodes, such a configuration with two divided shield electrodes reduces the influence on coupling between resonators when an external shield electrode of an external device is present nearby. Additionally, the divided shield electrodes hinder coupling between the resonators RC3 and RC4 via the shield electrodes.

"The shield electrode PG21" and "the shield electrode PG22" in the second preferred embodiment correspond to "a first shield electrode" and "a second shield electrode". "The via VG1" to "the via VG4" in the second preferred embodiment respectively correspond to "a first ground via" to "a fourth ground via".

Third Preferred Embodiment

The following describes a third preferred embodiment an example in which a filter device includes two resonators.

Figure 9:
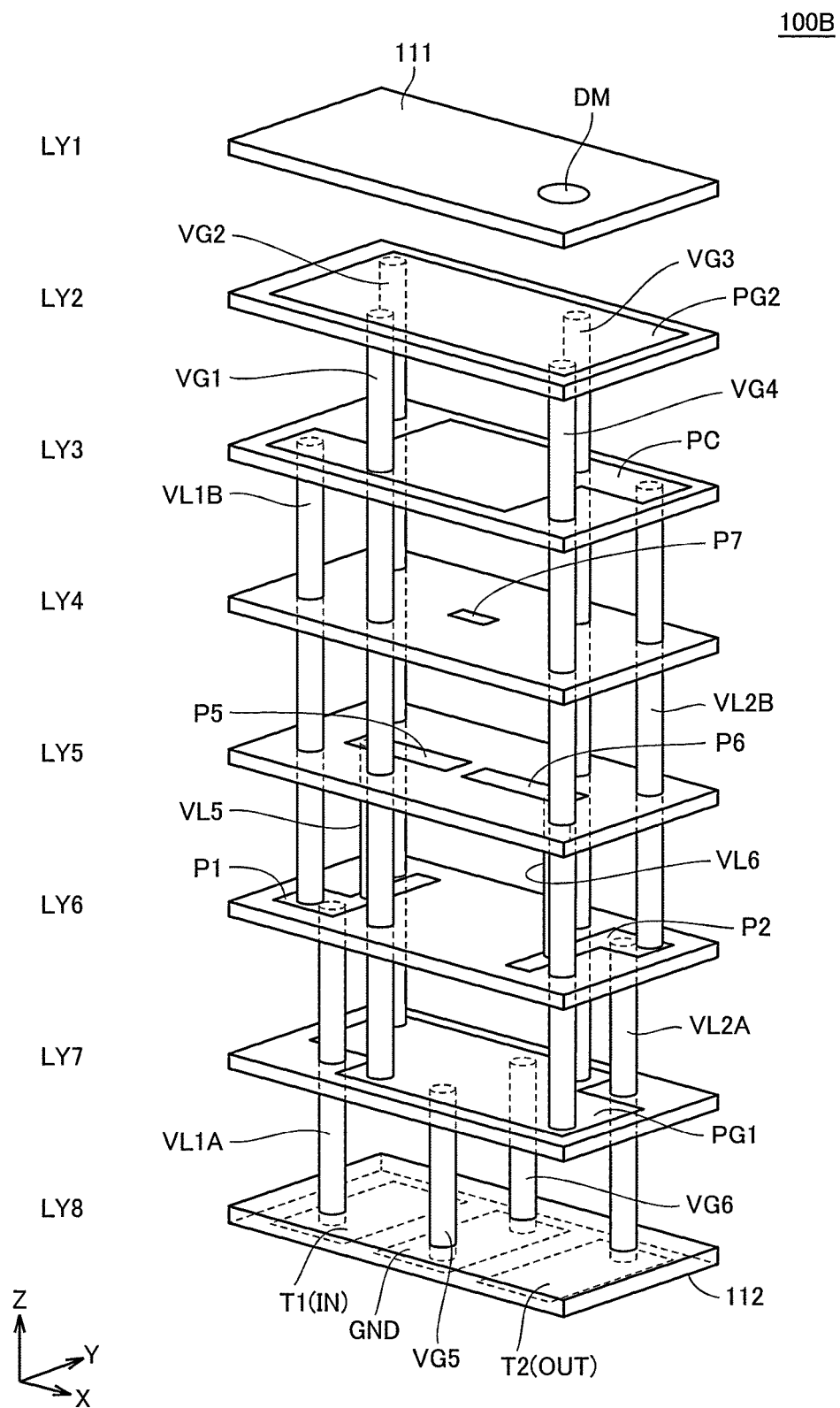
FIG. 9 is an exploded perspective view illustrating a layered structure of a filter device of a third preferred embodiment of the present invention.

FIG. 9 is an exploded perspective view illustrating a layered structure of a filter device 100B of the third preferred embodiment. In the filter device 100B, the resonators RC3 and RC4 of the filter device 100 of the first preferred embodiment are removed. More specifically, in the filter device 100B, the capacitor electrodes P3 and P4 and the vias VL3 and VL4 in FIG. 4 are removed. Regarding FIG. 9, redundant descriptions of the same elements as the filter device 100 illustrated in FIG. 4 are not repeated.

Because the vias VG2 and VG4 coupled to the ground electrode PG1 without passing resonators are provided for the shield electrode PG2, such a configuration with two-stage resonators as the filter device 100B reduces the influence on coupling between resonators when an external shield electrode of an external device is present nearby.

Fourth Preferred Embodiment

The following describes a fourth preferred embodiment an example in which a filter device includes three resonators.

Figure 10:
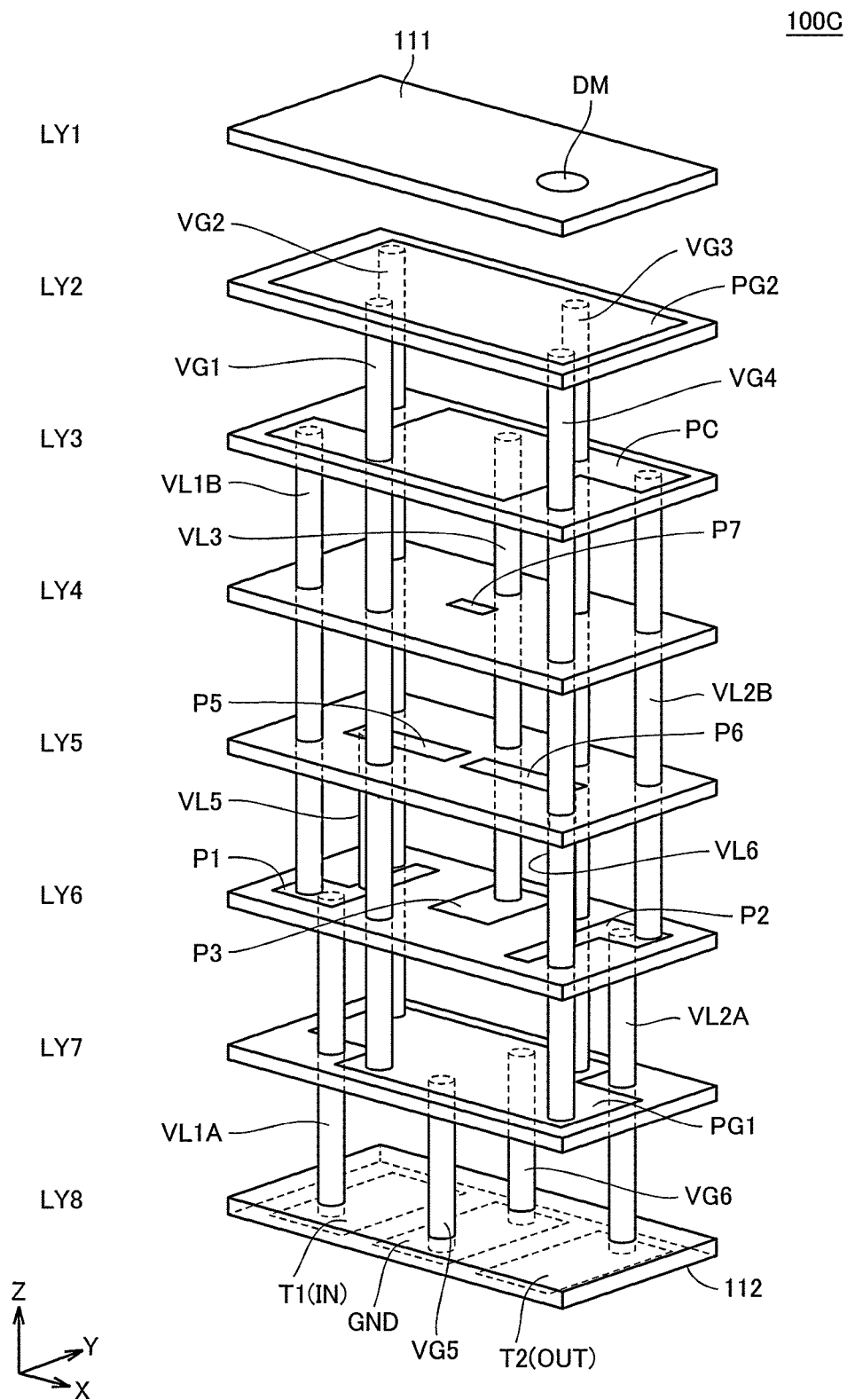
FIG. 10 is an exploded perspective view illustrating a layered structure of a filter device of a fourth preferred embodiment of the present invention.

FIG. 10 is an exploded perspective view illustrating a layered structure of a filter device 100C of the fourth preferred embodiment. In the filter device 100C, the resonator RC4 of the filter device 100 of the first preferred embodiment is removed. Regarding FIG. 10, redundant descriptions of the same elements as the filter device 100 illustrated in FIG. 4 are not repeated.

More specifically, in the filter device 100C, the capacitor electrode P4 and the via VL4 in FIG. 4 are removed. In the filter device 100C, the capacitor electrode P3 and the via VL3 defining the resonator RC3 are positioned at about the center of the multilayer body 110 in the X-axis direction. When viewed in plan view in the stacking direction of the multilayer body 110, the capacitor electrode P3 partially overlaps the capacitor electrodes P5 and P6 provided in the dielectric layer LY5.

Because the vias VG2 and VG4 coupled to the ground electrode PG1 without passing resonators are coupled to the shield electrode PG2, such a configuration with three-stage resonators as the filter device 100C reduces the influence on coupling between resonators when an external shield electrode of an external device is present nearby.

Fifth Preferred Embodiment

The following describes a fifth preferred embodiment an example in which a filter device includes one resonator.

Figure 11:
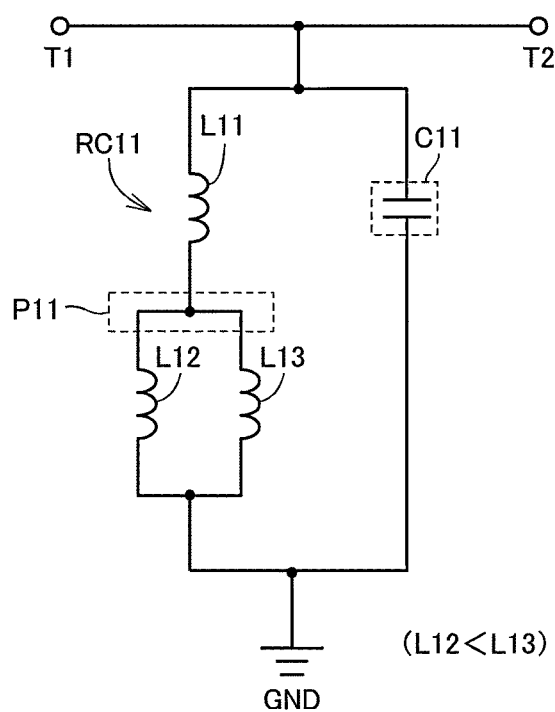
FIG. 11 is an equivalent circuit diagram of a filter device of a fifth preferred embodiment of the present invention.
Figure 12:
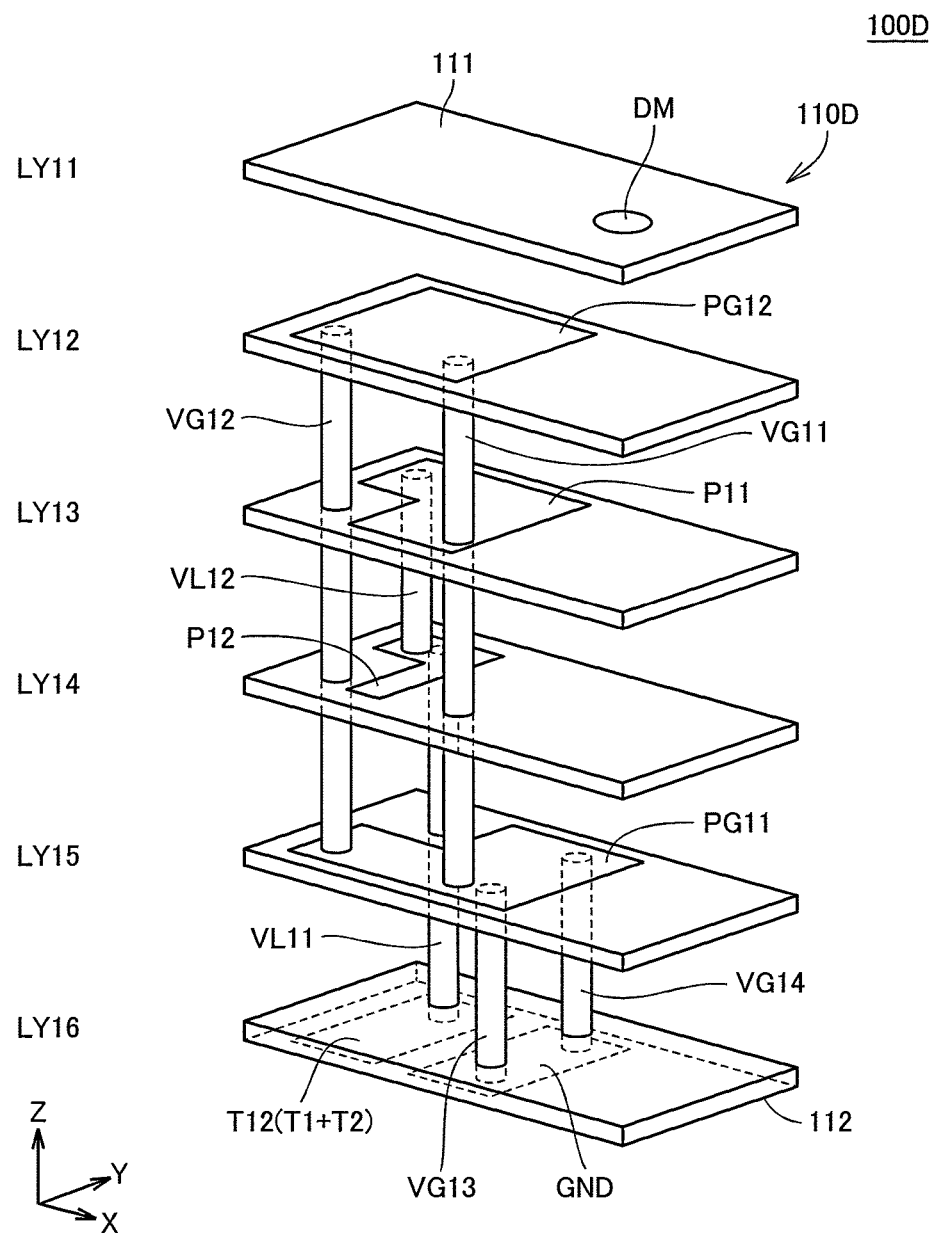
FIG. 12 is an exploded perspective view illustrating a layered structure of the filter device of the fifth preferred embodiment of the present invention.

FIG. 11 is an equivalent circuit diagram of a filter device 100D of the fifth preferred embodiment. FIG. 12 is an exploded perspective view illustrating a layered structure of the filter device 100D.

Firstly, referring to FIG. 11, the filter device 100D has a configuration in which a resonator RC11 is coupled between the ground terminal GND and a path connecting the input terminal T1 and the output terminal T2. The resonator RC11 includes inductors L11, L12, and L13 and a capacitor C11. One end of the inductor L11 is coupled to the input terminal T1 and the output terminal T2. The inductors L12 and L13 are coupled in parallel with each other between the other end of the inductor L11 and the ground terminal GND. The inductance of the inductor L13 is larger than the inductance of the inductor L12. The capacitor C11 is coupled between the input terminal T1 and the output terminal T2, and the ground terminal GND.

Next, referring to FIG. 12, a multilayer body 110D of the filter device 100D has a structure including a stack of multiple dielectric layers LY11 to LY16. Similarly to the filter device 100 of the first preferred embodiment, the orientation mark DM is provided on the upper surface 111 (the dielectric layer LY11). The input terminal T1, the output terminal T2, and the ground terminal GND are arranged at the lower surface 112 (the dielectric layer LY16). In the fifth preferred embodiment, the input terminal T1 and the output terminal T2 are defined by the same single plate electrode. For this reason, the input terminal T1 and the output terminal T2 are also collectively referred to as an "input-output terminal T12" in the following description.

The input-output terminal T12 is coupled to the capacitor electrode P12 provided in the dielectric layer LY14 by a via VL11. The capacitor electrode P12 is an almost L-shaped plate electrode. When viewed in plan view in the normal direction of the multilayer body 110D, the capacitor electrode P12 partially overlaps a ground electrode PG11 provided in the dielectric layer LY15. The ground electrode PG11 is coupled to the ground terminal GND in the dielectric layer LY16 by vias VG13 and VG14. The capacitor C11 in FIG. 11 is defined by the capacitor electrode P14 and the ground terminal GND.

The capacitor electrode P12 is also coupled to a plate electrode P11 provided in the dielectric layer LY13 by a via VL12. The inductor L11 in FIG. 11 is defined by the via VL12 and the plate electrode P11. The plate electrode P11 is coupled to a shield electrode PG12 provided in the dielectric layer LY12 and the ground electrode PG11 provided in the dielectric layer LY15 by the via VG11.

The shield electrode PG12 is an almost rectangular plate electrode. When viewed in plan view in the normal direction of the multilayer body 110D, the shield electrode PG12 covers the plate electrode P11 in the dielectric layer LY13. The shield electrode PG12 is directly coupled to the ground electrode PG11 by the via VG12 not via the plate electrode P11.

The inductor L12 in FIG. 11 includes the path from the plate electrode P11 to the ground electrode PG11 via only the via VG11. The inductor L13 in FIG. 11 includes the path from the plate electrode P11 to the ground electrode PG11 via the via VG11, the shield electrode PG12, and the via VG12. The plate electrode P11 corresponds to a portion of the connection node of the inductors L11, L12, and L13 in FIG. 11.

With such a configuration as well, the current flowing in the resonator RC11 flows mainly along the path from the plate electrode P11 to the ground electrode PG11 via only the via VG11, which is relatively short (the inductance of the path is relatively small), and almost no current flows along the path routed via the shield electrode PG12. As a result, when a shield electrode of an external device is present on the upper surface 111 side with respect to the filter device 100D, the influence on the filter device 100D is reduced.

"The plate electrode P11" in the fifth preferred embodiment corresponds to "a first electrode". "The via VG11" and "the via VG12" in the fifth preferred embodiment respectively correspond to "a fifth ground via" and "a sixth ground via". "The via VL12" in the fifth preferred embodiment corresponds to "a fifth via". "The capacitor electrode P12" in the fifth preferred embodiment corresponds to "a second electrode".

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a multilayer body including a stack of a plurality of dielectric layers, a first surface and a second surface;
an input terminal, an output terminal, and a ground terminal at the second surface of the multilayer body;
a common electrode closer to the first surface than to the second surface in the multilayer body;
a ground electrode coupled to the ground terminal;
a first resonator and a second resonator in a layer between the common electrode and the ground electrode;
a shield electrode closer to the first surface than the common electrode and covering the entire common electrode when viewed in plan view in a stacking direction of the multilayer body;
a first ground via coupling the shield electrode and the ground electrode via the common electrode; and
a second ground via directly coupling the shield electrode and the ground electrode without passing the common electrode;
the first resonator including:
a first via including one end coupled to the common electrode and another end coupled to the input terminal; and
a first plate electrode coupled to the first via and at least partially overlapping the ground electrode when viewed in plan view in the stacking direction;
the second resonator including:
a second via including one end coupled to the common electrode and another end coupled to the output terminal; and
a second plate electrode coupled to the second via and at least partially overlapping the ground electrode when viewed in plan view in the stacking direction.

2. The filter device according to claim 1, wherein a path from the common electrode to the ground electrode via the shield electrode and the second ground via is longer than a path from the common electrode to the ground electrode via the first ground via.

3. The filter device according to claim 1, wherein an inductance of a path from the common electrode to the ground electrode via the shield electrode and the second ground via is larger than an inductance of a path from the common electrode to the ground electrode via the first ground via.

4. The filter device according to claim 1, further comprising:
- a third resonator between the first resonator and the second resonator;
- the third resonator including:
- a third plate electrode at least partially overlapping the ground electrode when viewed in plan view in the stacking direction; and
- a third via between the common electrode and the third plate electrode.

5. The filter device according to claim 4, further comprising:
- a fourth resonator between the second resonator and the third resonator;
- the fourth resonator including:
- a fourth plate electrode at least partially overlapping the ground electrode when viewed in plan view in the stacking direction; and
- a fourth via between the common electrode and the fourth plate electrode.

6. The filter device according to claim 5, further comprising:
- a fifth plate electrode coupled to the first plate electrode and at least partially overlapping the third plate electrode when viewed in plan view in the stacking direction;
- a sixth plate electrode coupled to the second plate electrode and at least partially overlapping the fourth plate electrode when viewed in plan view in the stacking direction; and
- a seventh plate electrode at least partially overlapping the fifth plate electrode and the sixth plate electrode when viewed in plan view in the stacking direction.

7. The filter device according to claim 1, wherein the filter device is a band pass filter.

8. A radio-frequency front-end circuit comprising the filter device according to claim 1.

* * * * *